(12) United States Patent
Kwon et al.

(10) Patent No.: US 9,711,571 B2
(45) Date of Patent: Jul. 18, 2017

(54) SMART WINDOW COMPRISING ELECTROCHROMIC DEVICE AND ORGANIC LIGHT-EMITTING DEVICE

(71) Applicant: UNIVERSITY-INDUSTRY COOPERATION GROUP OF KYUNG HEE UNIVERSITY, Yongin-si, Gyeonggi-do (KR)

(72) Inventors: Jang Hyuk Kwon, Yongin-si (KR); Dong Cheol Choe, Incheon (KR)

(73) Assignee: UNIVERSITY-INDUSTRY COOPERATION GROUP OF KYUNG HEE UNIVERSITY (KR)

( * ) Notice: Subject to any disclaimer, the term of this patent is extended or adjusted under 35 U.S.C. 154(b) by 0 days.

(21) Appl. No.: 14/917,455

(22) PCT Filed: Sep. 5, 2014

(86) PCT No.: PCT/KR2014/008390
§ 371 (c)(1),
(2) Date: Mar. 8, 2016

(87) PCT Pub. No.: WO2015/037889
PCT Pub. Date: Mar. 19, 2015

(65) Prior Publication Data
US 2016/0225832 A1    Aug. 4, 2016

(30) Foreign Application Priority Data

Sep. 10, 2013 (KR) .......... 10-2013-0108365
Sep. 11, 2013 (KR) .......... 10-2013-0108883

(51) Int. Cl.
*H01L 51/52* (2006.01)
*H01L 27/32* (2006.01)
(Continued)

(52) U.S. Cl.
CPC ............ *H01L 27/3232* (2013.01); *E06B 9/24* (2013.01); *G02F 1/133555* (2013.01);
(Continued)

(58) Field of Classification Search
CPC ..................... H01L 51/5218; H01L 51/5231
(Continued)

(56) References Cited

U.S. PATENT DOCUMENTS 8,193,017 B2   6/2012   Kim et al.
8,796,702 B2   8/2014   Kim et al.
(Continued)

FOREIGN PATENT DOCUMENTS

CN   1809781   7/2006
CN   101326654  12/2008
(Continued)

OTHER PUBLICATIONS

International Search Report dated Oct. 22, 2014, issued in corresponding International Application No. PCT/KR2014/008390.
(Continued)

*Primary Examiner* — George Fourson, III
(74) *Attorney, Agent, or Firm* — Onello & Mello, LLP

(57) ABSTRACT

A smart window is provided. The smart window includes an organic light-emitting device including first and second electrodes corresponding to each other, and a light-emitting layer disposed between the first and second electrodes and containing an organic light-emitting material; an electrochromic device including an electrochromic layer containing an electrochromic material and disposed over the organic light-emitting device, wherein the organic light-emitting device is disposed under the electrochromic device to form a light transmission portion in a predetermined region, and wherein the first electrode is formed of a transparent electrode or a high-reflection translucent elec-
(Continued)

trode, and the second electrode is formed of a high-reflection electrode.

17 Claims, 5 Drawing Sheets

(51) Int. Cl.
*H01L 51/50* (2006.01)
*G02F 1/1335* (2006.01)
*G02F 1/15* (2006.01)
*E06B 9/24* (2006.01)
*G02F 1/155* (2006.01)

(52) U.S. Cl.
CPC ............... *G02F 1/15* (2013.01); *G02F 1/155* (2013.01); *H01L 51/50* (2013.01); *H01L 51/5206* (2013.01); *H01L 51/5218* (2013.01); *H01L 51/5221* (2013.01); *E06B 2009/247* (2013.01); *E06B 2009/2417* (2013.01); *E06B 2009/2464* (2013.01); *H01L 51/5231* (2013.01); *H01L 2251/301* (2013.01); *H01L 2251/5307* (2013.01); *H01L 2251/5315* (2013.01); *H01L 2251/5361* (2013.01)

(58) Field of Classification Search
USPC ...................................................... 257/40, 98
See application file for complete search history.

(56) References Cited

U.S. PATENT DOCUMENTS

| | | | |
|---|---|---|---|
| 8,970,798 B2 | 3/2015 | Ahn | |
| 2003/0103021 A1* | 6/2003 | Young | ............... G02F 1/133553 345/76 |
| 2007/0131949 A1* | 6/2007 | Liu | ...................... H01L 27/3232 257/89 |
| 2011/0220922 A1 | 9/2011 | Kim et al. | |
| 2012/0168783 A1 | 7/2012 | Kim et al. | |
| 2013/0021561 A1* | 1/2013 | Ahn | ................... G02F 1/133512 349/77 |
| 2014/0168745 A1* | 6/2014 | Satou | ...................... G02F 1/163 359/266 |
| 2014/0192036 A1* | 7/2014 | Kim | ...................... G09G 3/3433 345/211 |
| 2014/0217924 A1* | 8/2014 | Sato | ...................... H05B 33/08 315/294 |
| 2015/0155340 A1* | 6/2015 | Lim | ..................... H01L 27/3232 257/40 |
| 2015/0314731 A1* | 11/2015 | Popp | ...................... B60R 1/088 359/267 |
| 2015/0349138 A1* | 12/2015 | Sone | ................... H01L 29/7869 345/206 |
| 2016/0266459 A1* | 9/2016 | Oh | ......................... G02F 1/153 |
| 2016/0282695 A1* | 9/2016 | Agrawal | ................ B60R 1/088 |
| 2016/0365541 A1* | 12/2016 | Wehlus | ................ C03C 14/004 |
| 2017/0047020 A1* | 2/2017 | Yata | ...................... G09G 3/3413 |

FOREIGN PATENT DOCUMENTS

| | | |
|---|---|---|
| EP | 1964189 | 9/2008 |
| KR | 1020040068188 | 7/2004 |
| KR | 100796601 | 1/2008 |
| KR | 1020080080303 | 9/2008 |
| KR | 1020110103735 | 9/2011 |
| KR | 1020130010738 | 1/2013 |

OTHER PUBLICATIONS

Chinese Office Action dated Apr. 19, 2017 issued in corresponding Chinese Application No. 201480049681.9.

* cited by examiner

SMART WINDOW COMPRISING ELECTROCHROMIC DEVICE AND ORGANIC LIGHT-EMITTING DEVICE

This application claims priority from Korean Patent Application No. 10-2013-0108365 filed on Sep. 10, 2013 in the Korean Intellectual Property Office, and priority from Korean Patent Application No. 10-2013-0108883 filed on Sep. 11, 2013 in the Korean Intellectual Property Office, the disclosure of which are incorporated herein by reference in their entireties.

BACKGROUND

1. Field of the Invention

The present invention relates to a smart window including an electrochromic device and an organic light-emitting device.

2. Description of the Related Art

Generally, an organic light-emitting device includes an anode, a light-emitting layer disposed on the anode, and a cathode disposed on the light-emitting layer. When a voltage is applied between the anode and the cathode, holes are injected from the anode into the light-emitting layer, and electrons are injected from the cathode into the light-emitting layer. The holes and electrons injected into the light-emitting layer are recombined with each other to generate excitons, and such excitons are shifted from an excited state to a ground state to emit light.

Such an organic light-emitting device may be classified into a bottom emission type organic light-emitting device in which the light emitted from the light-emitting layer transmits the lower substrate adjacent to the anode and a top emission type organic light-emitting device in which the light emitted from the light-emitting layer transmits the upper substrate adjacent to the cathode. Further, such an organic light-emitting device may be realized as a dual emission type organic light-emitting device in which light is emitted to both bottom and top sides using a transparent anode and a transparent cathode.

The transparent organic light-emitting device realized as the dual emission type organic light-emitting device can be realized into a smart window, and, particularly, can be configured such that one side light emission or double side light emission can be selectively carried out by blocking or transmitting light by attaching an electrochromic device to one side thereof and controlling the color of the electrochromic device.

However, when the organic light-emitting device is realized as the dual emission type organic light-emitting device using a transparent anode and a transparent cathode, one side light emission or double side light emission can be selectively carried out by controlling the color of the electrochromic device, but there is a problem in that the light efficiency of this dual emission type organic light-emitting device is greatly lowered compared to that of a bottom emission type organic light-emitting device or a top emission type organic light-emitting device at the time of one side light emission, and the contrast ratio thereof is also lowered.

The present inventors have intensively made an effort to improve the light efficiency of an organic light-emitting device at the time of realizing a smart window by combining an electrochromic device with the organic light-emitting device. As a result, they found that the light efficiency and contrast ratio of the organic light-emitting device can be greatly improved by replacing a transparent electrode of a conventional organic light-emitting device disposed adjacent the electrochromic device with a high-reflection electrode and forming a predetermined light transmission portion. Based on the findings, the present invention has been completed.

SUMMARY

An aspect of the present invention provides a smart window having high light efficiency and high contrast ratio.

Another aspect of the present invention provides a smart window capable of improving light efficiency and contrast ratio without lowering transmittance by replacing one of the electrodes of an organic light-emitting device with a high-reflection electrode and forming a predetermined light transmission portion.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a smart window, including: an organic light-emitting device including first and second electrodes corresponding to each other, and a light-emitting layer disposed between the first and second electrodes and containing an organic light-emitting material; an electrochromic device including an electrochromic layer containing an electrochromic material and disposed over the organic light-emitting device, wherein the organic light-emitting device is disposed under the electrochromic device to form a light transmission portion in a predetermined region, and wherein the first electrode is formed of a transparent electrode or a high-reflection translucent electrode, and the second electrode is formed of a high-reflection electrode.

According to another aspect of the present invention, there is provided a smart window, including: a first transparent substrate; a first electrode disposed on the first transparent substrate; a light-emitting layer disposed on the first electrode and containing an organic light-emitting material; a second electrode disposed on the light-emitting layer; a bonding layer disposed on the second electrode; a third electrode disposed on the bonding layer; an electrochromic layer disposed on the third electrode and containing an electrochromic material; a fourth electrode disposed on the electrochromic layer; and a second transparent substrate disposed on the fourth electrode, wherein the first electrode, the light-emitting layer, and the second electrode are disposed to form a light transmission portion in a predetermined region between the first transparent substrate and the bonding layer, and wherein the first electrode is formed of a transparent electrode or a high-reflection translucent electrode, and the second electrode is formed of a high-reflection electrode.

According to still another aspect of the present invention, there is provided a smart window, including: a first transparent substrate; an organic light-emitting device disposed on the first transparent substrate; an electrochromic device disposed beneath the first transparent substrate; a second transparent substrate disposed beneath the electrochromic device; and a third transparent substrate disposed on the organic light-emitting device, wherein the organic light-emitting device includes a second electrode disposed on the first transparent substrate and formed of a high-reflection electrode, a light-emitting layer disposed on the second electrode and containing an organic light-emitting material, and a first electrode disposed on the light-emitting layer and formed of a transparent electrode or a high-reflection translucent electrode, wherein the electrochromic device includes a third electrode disposed beneath the first transparent substrate, an electrochromic layer disposed beneath the third electrode and containing an electrochromic material, and a fourth electrode disposed beneath the electrochromic layer, and wherein the first electrode, the light-emitting layer, and the second electrode is disposed to form a light transmission portion in a predetermined region between the first transparent substrate and the third transparent substrate.

According to still another aspect of the present invention, there is provided a smart window, including: an organic light-emitting device including first and second electrodes corresponding to each other, and a light-emitting layer disposed between the first and second electrodes and containing an organic light-emitting material; an electrochromic device including an electrochromic layer containing an electrochromic material and disposed over the organic light-emitting device, wherein the first electrode is formed of a transparent electrode or a high-reflection translucent electrode, and the second electrode is formed of a high-reflection translucent electrode.

According to still another aspect of the present invention, there is provided a smart window, including: a first transparent substrate; a first electrode disposed on the first transparent substrate; a light-emitting layer disposed on the first electrode and containing an organic light-emitting material; a second electrode disposed on the light-emitting layer; a bonding layer disposed on the second electrode; a third electrode disposed on the bonding layer; an electrochromic layer disposed on the third electrode and containing an electrochromic material; a fourth electrode disposed on the electrochromic layer; and a second transparent substrate disposed on the fourth electrode, wherein the first electrode is formed of a transparent electrode or a high-reflection translucent electrode, and the second electrode is formed of a high-reflection translucent electrode.

According to still another aspect of the present invention, there is provided a smart window, including: a first transparent substrate; an organic light-emitting device disposed on the first transparent substrate; an electrochromic device disposed beneath the first transparent substrate; a second transparent substrate disposed beneath the electrochromic device; and a third transparent substrate disposed on the organic light-emitting device, wherein the organic light-emitting device includes a second electrode disposed on the first transparent substrate and formed of a high-reflection electrode, a light-emitting layer disposed on the second electrode and containing an organic light-emitting material, and a first electrode disposed on the light-emitting layer and formed of a transparent electrode or a high-reflection translucent electrode, and wherein the electrochromic device includes a third electrode disposed beneath the first transparent substrate, an electrochromic layer disposed beneath the third electrode and containing an electrochromic material, and a fourth electrode disposed beneath the electrochromic layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
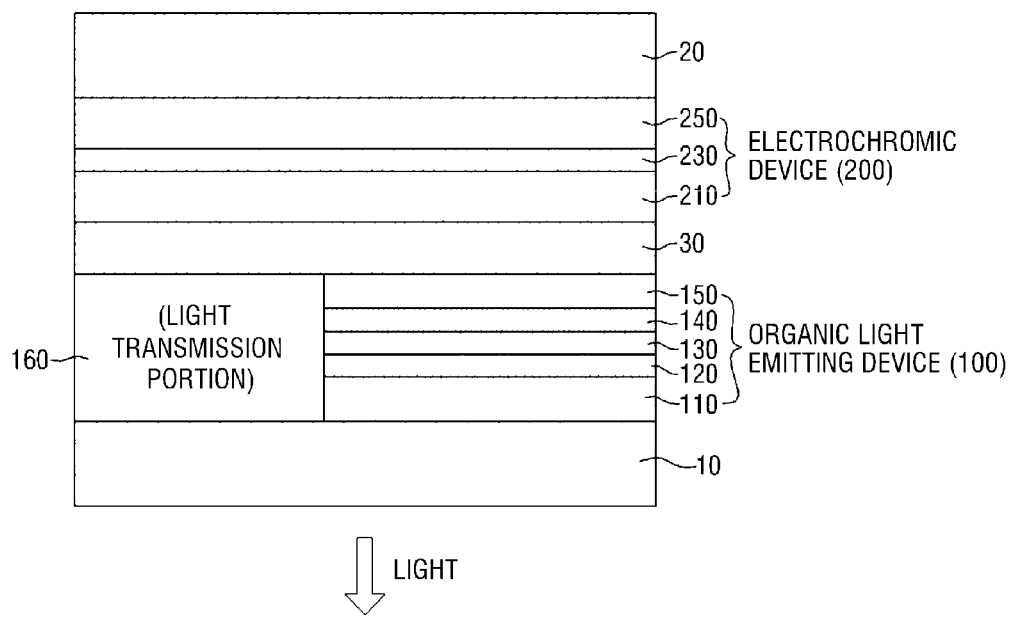
FIG. 1 is a schematic cross-sectional view of a smart window according to an embodiment of the present invention.

Advantages and features of the present invention and methods of accomplishing the same may be understood more readily by reference to the following detailed description of preferred embodiments and the accompanying drawings. The present invention may, however, be realized in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention. The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, the present invention will be described in more detail with reference to the attached drawings.

FIG. 1 is a schematic cross-sectional view of a smart window according to an embodiment of the present invention. For reference, the smart window shown in FIG. 1 is realized as a bottom emission type smart window configured such that electricity is applied to an electrochromic device 200 to form a light-blocking film and light emitted from one side of an organic light-emitting device 100 transmits a lower substrate adjacent to an anode.

Referring to FIG. 1, the smart window according to an embodiment of the present invention may include: a first transparent substrate 10; an organic light-emitting device 100 disposed on the first transparent substrate 10 and including a first electrode 110, a hole transport layer 120, a light-emitting layer 130, an electron transport layer 140, and a second electrode 150; a bonding layer 30 for attaching the organic light-emitting device 100 to an electrochromic device 200; the electrochromic device 200 disposed on the bonding layer 30 and including a third electrode 210, an electrochromic layer 230, and a fourth electrode 250; and a second transparent substrate 20 disposed on the electrochromic device 200.

The organic light-emitting device 100 is disposed such that a light transmission portion 160 is formed in a predetermined region between the first transparent substrate 10 and the bonding layer 30.

In an embodiment of the present invention, the first transparent substrate 10 may be made of an insulating material, and may also be made of a material having excellent light transmissivity. In some embodiments, the first transparent substrate 10 may be made of transparent glass or transparent plastic.

The first transparent substrate 10 is provided thereon with the organic light-emitting device 100 including the first electrode 110, the hole transport layer 120, the light-emitting layer 130, the electron transport layer 140, and the second electrode 150.

In this case, the organic light-emitting device 100 may be disposed such that the light transmission portion 160 is formed in a predetermined region between the first transparent substrate 10 and the bonding layer 30. The light transmission portion 160 may have a transmittance of 30% to 100%. Further, the area of the light transmission portion 160 having the transmittance range may account for 20% to 90% of the total area of the smart window.

The first electrode 110 may be formed on the first transparent substrate 10. The first electrode 110 may be realized into a high-reflection translucent electrode having a reflectivity of 50% or more, which is made of transparent conductive oxide material having good transmittance and conductivity, such as ITO, IZO or AZO; a conductive polymer material; a material containing Ag nanoparticles, carbon nanotubes or graphene; or a metal, such as Ag or Al. The first electrode may have a single-layer structure using a material including at least one of the above components, or may have a multi-layer structure containing these components. Generally, the high-reflection translucent electrode may be realized to have a single-layer structure, and may also be realized to have a multi-layer structure. Further, the high-reflection translucent electrode may have a structure in which a transparent oxide electrode made of ITO, IZO or AZO is combined with a dielectric mirror having multiple layers made of low-refractive and high-refractive materials.

The high-reflection translucent electrode may be configured to have a light reflectance of 10% to 95% and become a translucent state by adjusting the thickness and opening ratio of the electrode. Further, the high-reflection translucent electrode may have a light transmittance of 15% to 95%, but is not limited thereto. Hereinafter, the high-reflection translucent electrode is referred to as an electrode having a light reflectance of 10% to 95% and a light transmittance of 15% to 95%. For reference, in the present embodiment, the first electrode 110 is realized into an anode.

The hole transport layer 120 may be formed on the first electrode 110. In some embodiments, the hole transport layer 120 may contains at least one of NPB, TPD, m-MTDATA, NPD, TMTPD, TDATA, TAPC, CBP, HMTPD, TPBI, and TCTA.

The light-emitting layer 130 may be formed on the hole transport layer 120, and may have a phosphorescent host-dopant system. In some embodiments, TCTA, CBP, TAZ, mCP, or TPD may be used as the host material of the light-emitting layer 130, and Firfic, Fir6, or Ir(ppy)3 Ir(ppy)(acac) may be used as the dopant material thereof.

The electron transport layer 140 may be formed on the light-emitting layer 130. In some embodiments, TmPypb, BCP, Alq3, TPBI, or Bphen may be used as the material of the electron transport layer 140.

The second electrode 150 may be formed on the electron transport layer 140. The second electrode 150 may be a high-reflection electrode containing Ag, Al, or the like having good reflectivity and conductivity, and may be a multi-layered high-reflection electrode containing these components. Further, the second electrode 150 may be an electrode using a dielectric mirror having multiple layers made of low-refractive and high-refractive materials. In some embodiments, the high-reflection electrode may be configured to have a light reflectance of 80% or more by adjusting the thickness and opening ratio thereof. For reference, in the present embodiment, the second electrode 150 is realized into a cathode.

For reference, the organic light-emitting device 100 may be configured by forming an additional layer or excluding the existing layer, and the position of the hole transport layer 120 and the position of the electron transport layer 140 may be changed to each other. In this case, of course, the polarity of the first electrode 110 and the polarity of the second electrode 150 may also become different from each other.

The bonding layer 30 is formed on the second electrode 150 to attach the organic light-emitting device 100 to the electrochromic device 200. The bonding layer 30 may be realized in the form of a polymer film having good transmittance, a transparent substrate, a high-density inorganic/organic multi-layered film, a $WO_3$-containing film, or an $Al_2O_3$-containing film, but the present invention is not limited thereto. In some embodiments, the bonding layer 30 may be realized in the form of an optical clear adhesive (OCA) film.

The electrochromic device 200 may be disposed on the bonding layer, and may include the third electrode 210, the electrochromic layer 230, and the fourth electrode 250.

The third electrode 210 may be formed on the bonding layer in order to apply electricity to the electrochromic layer 230. In some embodiments, the third electrode 210 may be made of a transparent conductive oxide material having good transmissivity and conductivity, such as ITO, IZO or AZO, a conductive polymer material, or a material containing Ag, Ag nanoparticles, carbon nanotubes or gaphene, may be a transparent electrode containing at least one selected from these materials, and may also be a transparent electrode having a multi-layer structure containing these materials.

The electrochromic layer 230 is formed on the third electrode 210, and may be composed of an electrochromic material and a material capable of accelerating the oxidation-reduction reaction of the electrochromic material. The electrochromic layer 230 may be realized in a multi-layered thin film state, a solution state, or a mixed state thereof. For example, in the electrochromic layer formed in a multi-layered thin film state, metal oxide, such as $WO_3$ or $IrO_2$, may be used as the electrochromic material, and, in the electrochromic layer formed in a solution state, a leuco dye may be used as the electrochromic material. Further, an electrolyte salt having excellent conductivity may be used as the material capable of accelerating the oxidation-reduction reaction of the electrochromic material, and an electron-accepting molecule may be used as an electrochemical catalyst (electrocatalyst). Hereinafter, the materials that can be used in the electrochromic layer 230 will be additionally described.

The fourth electrode 250 may be formed on the electrochromic layer 230 in order to apply a voltage to the electrochromic layer 230. In some embodiments, the fourth electrode 250 may be made of a transparent conductive oxide material having good transmissivity and conductivity, such as ITO, IZO or AZO, a conductive polymer material, or a material containing Ag, Ag nanoparticles, carbon nanotubes or gaphene, may be a transparent electrode containing at least one selected from these materials, and may also be a transparent electrode having a multi-layer structure containing these materials.

The second transparent substrate 20 may be formed on the fourth electrode 250 to seal all the devices, and may be made of transparent glass or transparent plastic having excellent light transmissivity.

Figure 2:
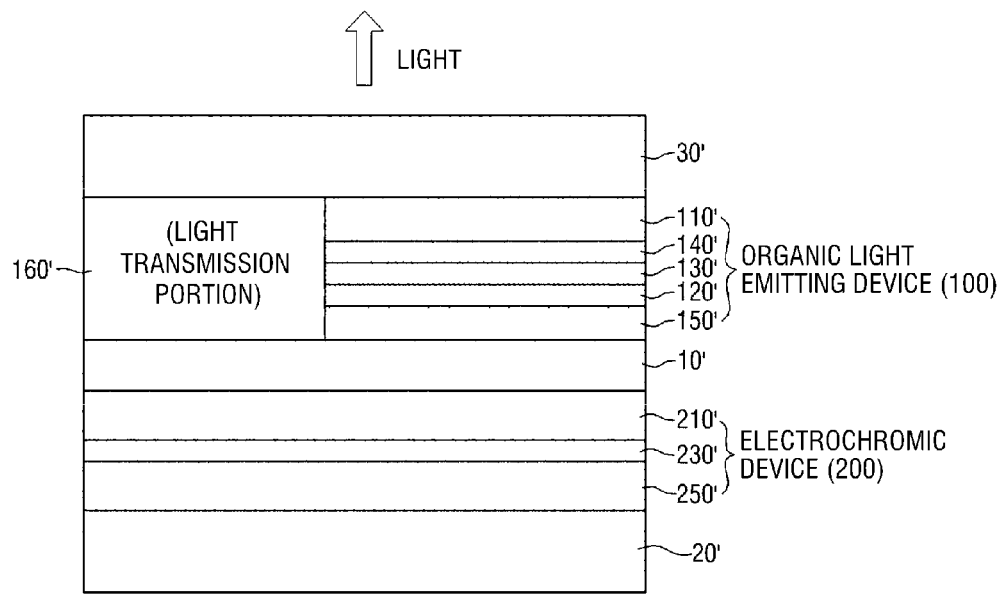
FIG. 2 is a schematic cross-sectional view of a smart window according to another embodiment of the present invention.

FIG. 2 is a schematic cross-sectional view of a smart window according to another embodiment of the present invention. For reference, the smart window shown in FIG. 2 is realized as a top emission type smart window configured such that electricity is applied to an electrochromic device 200 to form a light-blocking film and light emitted from one side of an organic light-emitting device 100 transmits an upper substrate adjacent to a cathode.

Referring to FIG. 2, the smart window according to another embodiment of the present invention may include: a first transparent substrate 10'; an organic light-emitting device 100 disposed on the first transparent substrate 10' and including a second electrode 150', a hole transport layer 120', a light-emitting layer 130', an electron transport layer 140', and a first electrode 110'; a third transparent substrate 30' disposed on the organic light-emitting device 100; an electrochromic device 200 disposed beneath the first transparent substrate 10' and including a third electrode 210', an electrochromic layer 230', and a fourth electrode 250'; and a second transparent substrate 20' disposed beneath the electrochromic device 200. Here, the organic light-emitting device 100 is disposed such that a light transmission portion 160' is formed in a predetermined region between the first transparent substrate 10' and the third transparent substrate 30'.

In another embodiment of the present invention, the second transparent substrate 20' may be made of an insulating material, and may be made of a material having excellent light transmissivity. In some embodiments, the first transparent substrate 10 may be made of transparent glass or transparent plastic.

The electrochromic device 200 including the third electrode 210', the electrochromic layer 230', and the fourth electrode 250' is formed on the second transparent substrate 20'.

The fourth electrode 250' may be formed on the second transparent substrate 20' in order to apply electricity to the electrochromic layer 230'. In some embodiments, the fourth electrode 250' may be made of a transparent conductive oxide material having good transmissivity and conductivity, such as ITO, IZO or AZO, a conductive polymer material, or a material containing Ag, Ag nanoparticles, carbon nanotubes or gaphene, may be a transparent electrode containing at least one selected from these materials, and may also be a transparent electrode having a multi-layer structure containing these materials.

The electrochromic layer 230' is formed on the fourth electrode 250', and may be composed of an electrochromic material and a material capable of accelerating the oxidation-reduction reaction of the electrochromic material. The electrochromic layer 230' may be realized in a multi-layered thin film state, a solution state, or a mixed state thereof. For example, in the electrochromic layer formed in a multi-layered thin film state, metal oxide, such as $WO_3$ or $IrO_2$, may be used as the electrochromic material, and, in the electrochromic layer formed in a solution state, a leuco dye may be used as the electrochromic material. Further, an electrolytic solution having excellent conductivity may be used as the material capable of accelerating the oxidation-reduction reaction of the electrochromic material, and an electron-accepting molecule may be used as an electrochemical catalyst (electrocatalyst). Hereinafter, the materials that can be used in the electrochromic layer 230' will be additionally described.

The third electrode 210' may be formed on the electrochromic layer 230' in order to apply electricity to the electrochromic layer 230'. In some embodiments, the third electrode 210' may be made of a transparent conductive oxide material having good transmissivity and conductivity, such as ITO, IZO or AZO, a conductive polymer material, or a material containing Ag, Ag nanoparticles, carbon nanotubes or gaphene, may be a transparent electrode containing at least one selected from these materials, and may also be a transparent electrode having a multi-layer structure containing these materials.

The first transparent substrate 10' may be formed on the electrochromic device 200. The first transparent substrate 10' may be made of an insulating material, and may be made of a material having excellent light transmissivity. In some embodiments, the second transparent substrate 20' may be made of transparent glass or transparent plastic.

The first transparent substrate 10' is provided thereon with the organic light-emitting device 100 including the second electrode 150', the hole transport layer 120', the light-emitting layer 130', the electron transport layer 140', and the first electrode 110'. In this case, the organic light-emitting device 100 may be disposed such that the light transmission portion 160' is formed in a predetermined region between the first transparent substrate 10' and the third transparent substrate 30'. The light transmission portion 160' may have a transmittance of 30% to 100%. In some embodiments, the light transmission portion 160' may be provided with an electrode or an organic layer. The area of the light transmission portion 160' having the transmittance range may account for 20% to 90% of the total area of the smart window.

The second electrode 150' may be formed on the first transparent substrate 10'. In some embodiments, the second electrode 150' may be a high-reflection electrode having good light reflectivity and conductivity, which contain at least one of Ag and Al, or may be a high-reflection electrode having a multi-layer structure containing these components. Further, the second electrode 150' may be an electrode using a dielectric mirror having multiple layers formed by laminating low-refractive and high-refractive materials. In some embodiments, the high-reflection electrode may be configured to have a light reflectance of 80% or more by adjusting the thickness and opening ratio of the electrode. For reference, in the present embodiment, the second electrode 150' is realized into an anode.

The hole transport layer 120' may be formed on the second electrode 150'. In some embodiments, the hole transport layer 120' may contains at least one of NPB, TPD, m-MTDATA, NPD, TMTPD, TDATA, TAPC, CBP, HMTPD, TPBI, and TCTA.

The light-emitting layer 130' may be formed on the hole transport layer 120', and may have a phosphorescent host-dopant system. In some embodiments, TCTA, CBP, TAZ, mCP, or TPD may be used as the host material of the light-emitting layer 130', and Firfic, Fir6, or Ir(ppy)3 Ir(ppy) (acac) may be used as the dopant material thereof.

The electron transport layer 140' may be formed on the light-emitting layer 130'. In some embodiments, the electron transport layer 140' may contain at least one of TmPypb, BCP, Alq3, TPBI, and Bphen.

The first electrode 110' may be formed on the electron transport layer 140'. In some embodiments, the first electrode 110' may be made of a transparent conductive oxide material having good transmissivity and conductivity, such as ITO, IZO or AZO, a conductive polymer material, or a material containing Ag, Ag nanoparticles, carbon nanotubes or gaphene, may be a transparent electrode containing at least one selected from these materials, and may also be a transparent electrode having a multi-layer structure containing these materials. For reference, in the present embodiment, the first electrode 110' is realized into a cathode.

For reference, in another embodiment of the present invention, the first electrode 110' may be realized into a high-reflection translucent electrode. When the cathode, which is the first electrode 110', is realized into a high-reflection translucent electrode, high color tone and light efficiency can be obtained by using the resonance effect occurring between the anode (high-reflection electrode) and the cathode (high-reflection translucent electrode). The high-reflection translucent electrode may be an electrode containing Ag or Al, or may be a translucent electrode having a multi-layer structure containing these components.

For reference, the organic light-emitting device 100 may be configured by forming an additional layer or excluding the existing layer, and the position of the hole transport layer 120' and the position of the electron transport layer 140' may be changed to each other. In this case, of course, the polarity of the first electrode 110' and the polarity of the second electrode 150' may also become different from each other.

The third transparent substrate 30' may be formed on the first electrode 110' to seal all the devices, and may be made of transparent glass or transparent plastic having excellent light transmissivity.

Figure 3:
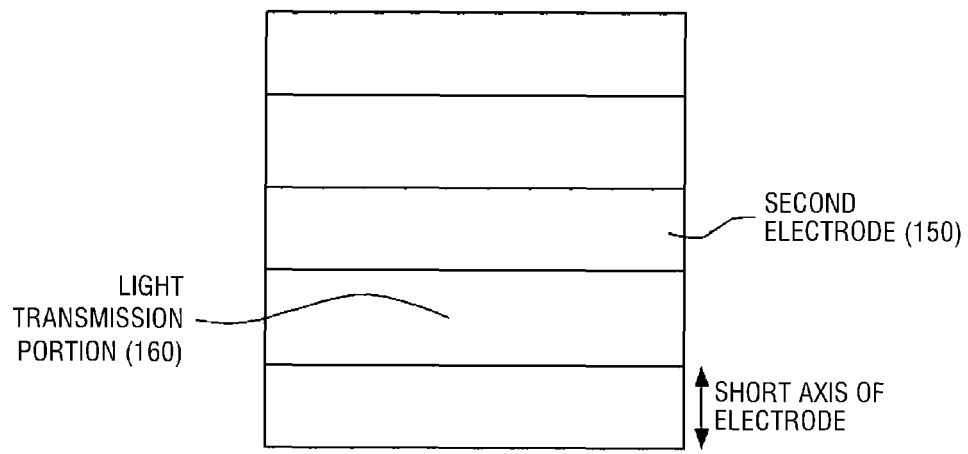
FIG. 3 is a schematic plan view of an electrode having a stripe structure of an organic light-emitting device according to the embodiment shown in FIG. 1 or 2.
Figure 4:
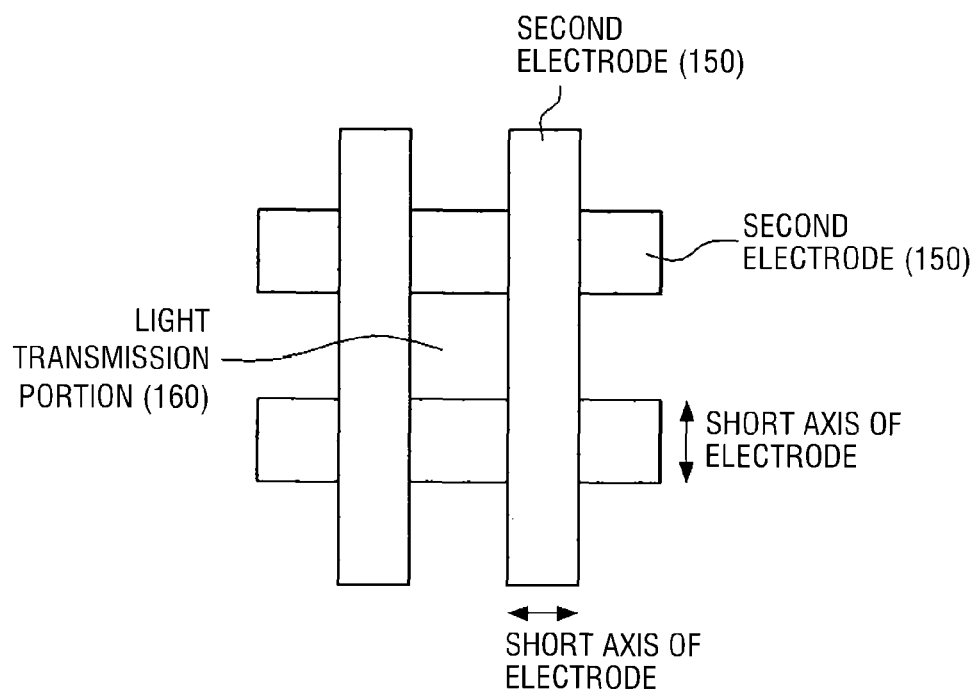
FIG. 4 is a schematic plan view of an electrode having a mesh structure of an organic light-emitting device according to the embodiment shown in FIG. 1 or 2.
Figure 5:
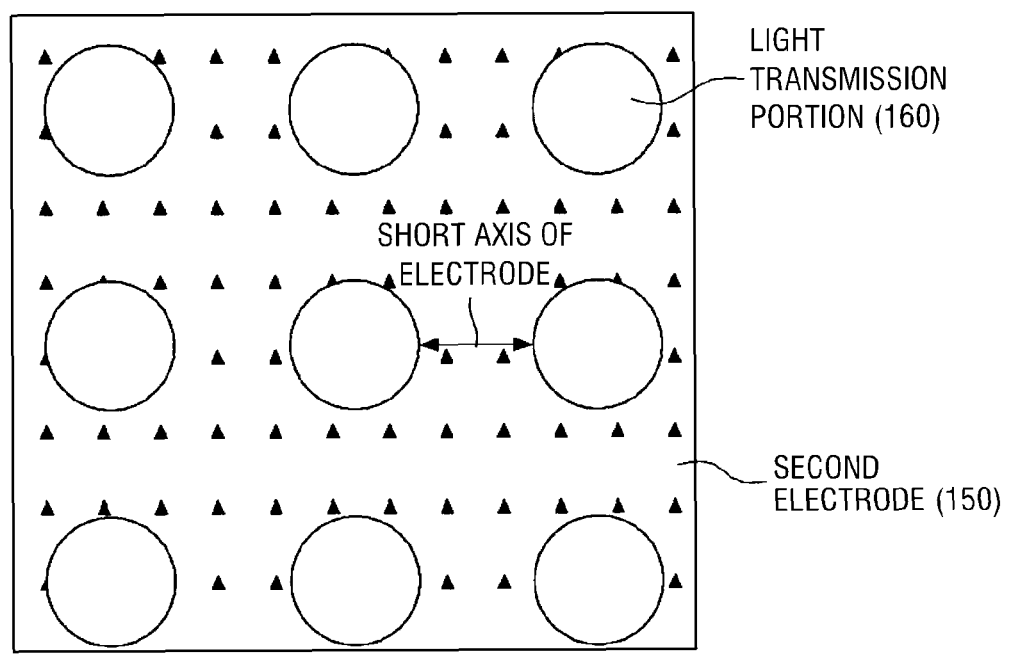
FIG. 5 is a schematic plan view of an electrode having a porous structure of an organic light-emitting device according to the embodiment shown in FIG. 1 or 2.

Meanwhile, FIGS. 3 to 5 show the electrode structures of the organic light-emitting device according to the present invention.

In order to make a transparent device, the areas of the light transmission portion 160 or 160', the first electrode 110 or 110', and the second electrode 150 or 150' must be set so as to minimize the degradation of image quality while assuring high transmittance. In the present invention, the transmittance can be assured by forming a light transmission portion (or transparent window). In some embodiments, the light transmission portion 160 or 160' may be configured such that its area accounts for 20% to 90% of the total area of the smart window.

Particularly, in the case of bottom emission, the second electrode 150 or 150' may be configured such that it is recognized or not recognized by human eyes when the smart window of the present invention is transparent. In some embodiments, the second electrode 150 may be configured to have a stripe structure as shown in FIG. 3, or may be configured to have a mesh structure as shown in FIG. 4. The short axis of the second electrode 150 may be set to 500 um or less. Further, as shown in FIG. 5, when the second electrode 150 has a porous structure, the shortest distance between portions other than the light transmission portion 160 may be 500 um or less.

Meanwhile, in the case of a top emission type organic light-emitting device (OLED), the light transmission portion 160 or 160' may be configured to have a stripe structure as shown in FIG. 3, or may be configured to have a mesh structure as shown in FIG. 4. The short axis of a portion (non-transmission portion) other than the light transmission portion 160 or 160' may be set to 500 um or less. Further, as shown in FIG. 5, when the portion (non-transmission portion) other than the light transmission portion 160 has a porous structure, the shortest distance between portions other than the light transmission portion 160 may be 500 um or less. However, the aforementioned content is only one example, and the shape of the light transmission portion of the smart window according to the present invention may be variously changed.

Figure 6:
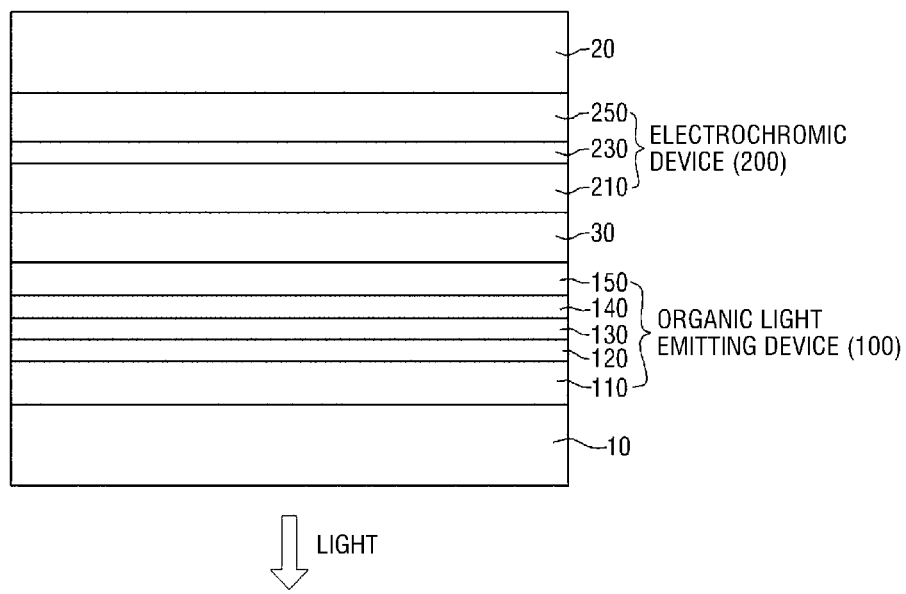
FIG. 6 is a schematic cross-sectional view of a smart window according to still another embodiment of the present invention.

FIG. 6 is a schematic cross-sectional view of a smart window according to still another embodiment of the present invention. For reference, the smart window shown in FIG. 6 is realized as a bottom emission type smart window configured such that electricity is applied to an electrochromic device 200 to form a light-blocking film and light emitted from one side of an organic light-emitting device 100 transmits a lower substrate adjacent to an anode. In the present embodiment, the organic light-emitting device 100 can be configured to enable light transmission even when a light transmission portion is not provided.

Referring to FIG. 6, the smart window according to still another embodiment of the present invention may include: a first transparent substrate 10; an organic light-emitting device 100 disposed on the first transparent substrate 10 and including a first electrode 110, a hole transport layer 120, a light-emitting layer 130, an electron transport layer 140, and a second electrode 150; a bonding layer 30 for attaching the organic light-emitting device 100 to an electrochromic device 200; the electrochromic device 200 disposed on the bonding layer 30 and including a third electrode 210, an electrochromic layer 230, and a fourth electrode 250; and a second transparent substrate 20 disposed on the electrochromic device 200.

The smart window according to the present embodiment is different from the smart window shown in FIG. 1 in that a light transmission portion is not provided. Besides, since other configuration of the smart window according to the present embodiment is identical to or similar to that of the smart window shown in FIG. 1, redundant descriptions will be omitted.

The second electrode 150 may be realized into a light-transmittable electrode by decreasing the thickness of a high-reflection electrode. The high-reflection electrode may contain Ag or Al. The high-reflection electrode may be configured to have a single layer structure or a multi-layer structure. The high-reflection electrode may be configured to have a light reflectance of 50% or more and become a translucent state by adjusting the thickness and opening ratio of the electrode. In some embodiments, the high-reflection electrode may be made of a material having a light reflectance of 50% to 95%. The light transmittance of the high-reflection electrode can be controlled by adjusting the thickness thereof. For reference, in the present embodiment, the second electrode 150 is realized into a cathode.

Figure 7:
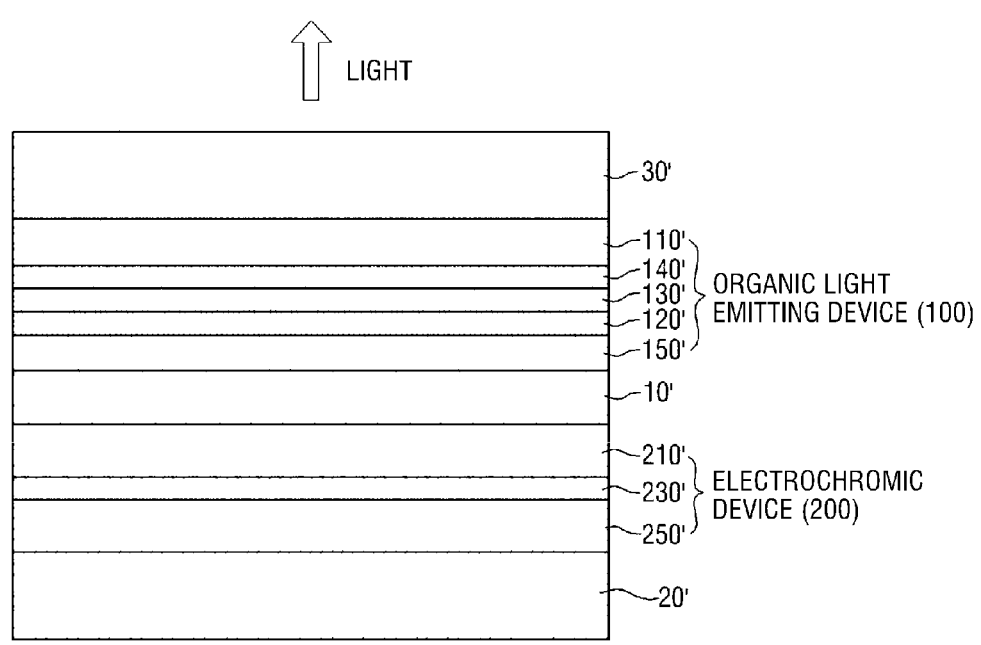
FIG. 7 is a schematic cross-sectional view of a smart window according to still another embodiment of the present invention.

FIG. 7 is a schematic cross-sectional view of a smart window according to still another embodiment of the present invention. For reference, the smart window shown in FIG. 7, similarly to the smart window shown in FIG. 2, is realized as a top emission type smart window configured such that electricity is applied to an electrochromic device 200 to form a light-blocking film and light emitted from one side of an organic light-emitting device 100 transmits an upper substrate adjacent to a cathode.

Referring to FIG. 7, the smart window according to still another embodiment of the present invention may include: a first transparent substrate 10'; an organic light-emitting device 100 disposed on the first transparent substrate 10' and including a second electrode 150', a hole transport layer 120', a light-emitting layer 130', an electron transport layer 140', and a first electrode 110'; a third transparent substrate 30' disposed on the organic light-emitting device 100; an electrochromic device 200 disposed beneath the first transparent substrate 10' and including a third electrode 210', an electrochromic layer 230', and a fourth electrode 250'; and a second transparent substrate 20' disposed beneath the electrochromic device 200.

The smart window according to the present embodiment is different from the smart window shown in FIG. 2 in that a light transmission portion is not provided. Besides, since other configuration of the smart window according to the present embodiment is identical to or similar to that of the smart window shown in FIG. 2, redundant descriptions will be omitted.

In the present embodiment, the organic light-emitting device 100 can be configured to enable light transmission even when a light transmission portion is not provided.

The second electrode 150' may be formed on the first transparent substrate 10'. In some embodiments, the second electrode 150' may be a high-reflection electrode containing at least one of Ag and Al having good light reflectivity and conductivity, and may also be a high-reflection electrode having a multi-layer structure containing these components. The second electrode 150', that is, the high-reflection electrode may be configured to have a light reflectance of 50% or more and become a translucent state by adjusting the thickness and opening ratio of the electrode. In some embodiments, the light transmittance of the high-reflection electrode can be controlled to be suitable for optical characteristics by using a material having a light reflectance of 50% to 95% and adjusting the thickness thereof. For reference, in the present embodiment, the second electrode 150' is realized into an anode.

The aforementioned electrochromic layer according to the embodiments of the present invention can be formed using a solution including an electrochromic material, an electrolyte salt, a solvent, and an electro-accepting molecule. Specific examples of each of the components are as follows.

[Electrochromic Material]

The electrochromic material may include an isobenzofuranone-based compound. The isobenzofuranone-based compound may include an amino group as an electron donor unit. The isobenzofuranone-based compound may include a lactone ring, and may be discolored by a lactone ring-opening reaction. In some embodiments, a leuco dye may be used as the electrochromic material. Further, the electrochromic material may include a metal oxide, such as $WO_3$ or $IrO_2$, or may include a conductive polymer.

In some embodiments, as the electrochromic material, at least one selected from black leuco dyes, such as Black 100 of Formula 1, ETAC of Formula 2, Black 400 of Formula 3, Black 305 of Formula 4, S-205 of Formula 5, and NIR Black 78 of Formula 6; a blue leuco dye, such as crystal violet lactone (CVL) of Formula 7; and red leuco dyes, such as Red 500 of Formula 8 and Red 520 of Formula 9 may be used. In some embodiments, the weight ratio of the leuco dye added to the electrolyte may be 2 wt % to 60 wt %, and preferably 2 wt % to 30 wt %.

[Formula 1]

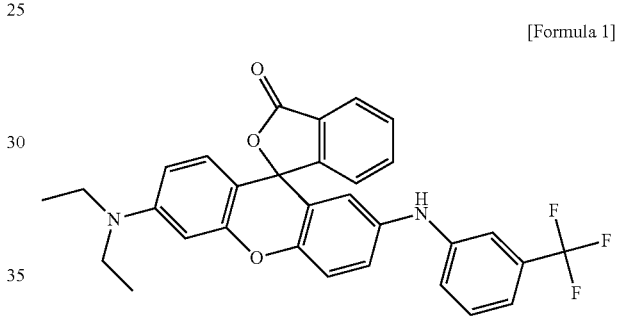

[Formula 2]

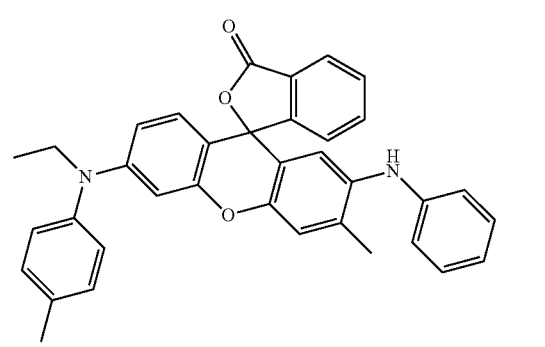

[Formula 3]

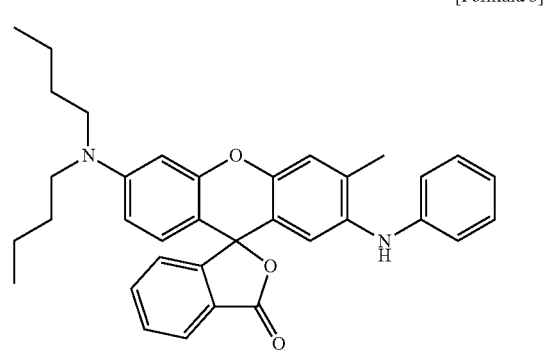

[Formula 4]

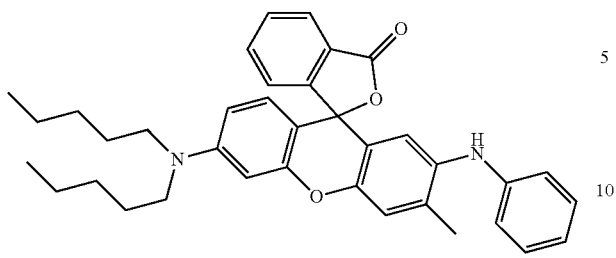

[Formula 5]

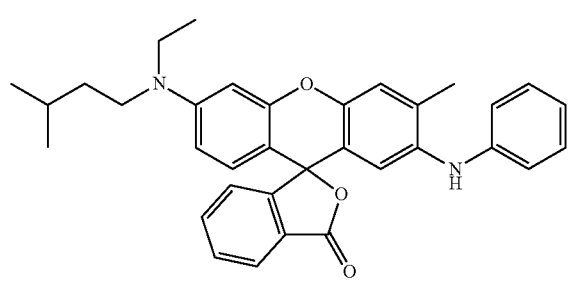

[Formula 6]

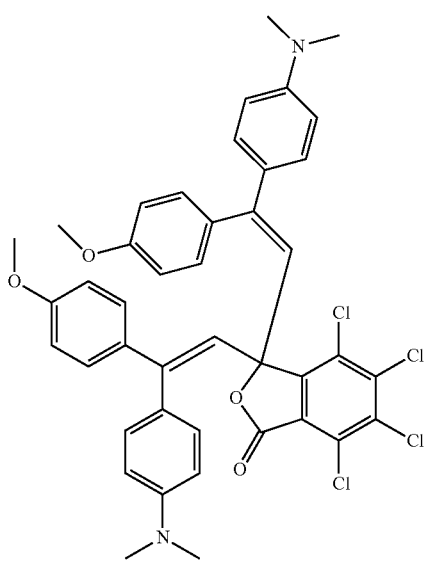

[Formula 7]

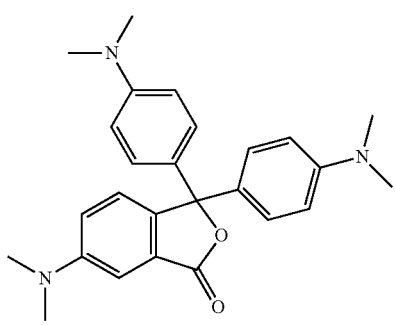

[Formula 8]

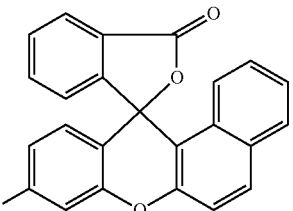

[Formula 9]

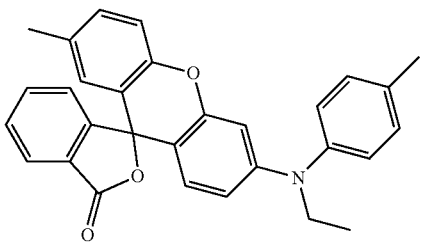

[Electrolyte Salt]

Examples of the electrolyte salt may include, but are not limited to, alkali metal salts of perchloric acid, such as $LiClO_4$, $NaClO_4$, $KClO_4$, and $RbClO_4$, $NH_4ClO_4$, $HClO_4$, tetra-n-butylammonium bromide, tetra-n-butyl ammonium chloride, tetra-n-butylammonium tetrafluoroborate, tetra-n-butylammonium hexafluorophosphate, tetra-n-butylammonium dihydrogentrifluoride, and tetra-n-butylammonium iodide. In some embodiments, the weight ratio of the electrolyte salt added to the electrolyte may be 1 wt % to 30 wt %, and preferably 5 wt % to 20 wt %.

[Solvent]

Specific examples of the solvent may include, but are not limited to, organic solvents containing amide, such as N,N-diethylacetamide, dimethylacetamide, dimethylformamide, N-methyl-2-pyrrolidone, N-methylformamide, N-vinylpyrrolidone, formamide, and 2-pyrrolidone; organic solvents containing ester, such as benzyl benzoate, butyl acetate, ethyl acetate, ethyl acetoacetate, ethyl butyrate, ethyl lactate, isopropyl acetate, methyl acetate, methyl butyrate, methyl phenylacetate, methyl propionate, dioctyl terephthalate, hexyl acetate, isoamyl acetate, isobutyl acetate, propyl acetate, and triacetin; and polar organic solvent containing carbonate, such as propylene carbonate, ethylene carbonate, and vinylene carbonate.

[Electron-Accepting Molecule]

Specific examples of the electron-accepting molecule may include, but are not limited to, hydroquinone-based compounds, such as hydroquinone, methylhydroquinone, methoxyhydroquinone, acetylhydroquinone, dimethylhydroquinone, trimethylhydroquinone, methylhydroquinone, butylhydroquinone, and t-butylhydroquinone; benzil; and ferrocene-based compounds, such as ferrocene, methylferrocene, diethylferrocene, acetylferrocene, ethylferrocene, vinylferrocene, diphenylferrocene, methoxy-methylferrocene, butylferrocene, t-butylferroce, and chloromethyl ferrocene. In some embodiments, the weight ratio of the electron-accepting molecule added to the electrolyte may be 5 wt % to 50 wt %, and preferably 5 wt % to 20 wt %.

Hereinafter, Experimental Examples related to the present invention will be described.

Experimental Example 1

<Fabrication of Organic Light-Emitting Device>

As shown in FIG. 2, an ITO film provided with a high-reflection layer made of a silver(Ag)-containing alloy was formed to a thickness of 150 nm on an organic substrate, which is used as a first transparent substrate 10', and an organic material layer was formed on the ITO film by thermal deposition at a vacuum of $2.5 \times 10^{-7}$ torr or less, so as to obtain a high-reflection electrode 150'. Then, a hole transport layer 120' of DNTPD(75 nm)/HATCN(7 nm)/NPB (108 nm), a light-emitting layer 130' of Be(btz)$_2$:Ir(mphmg)$_2$(acac)[3%](40 nm), an electron transport layer 140' of Liq:Lg201(40 nm), and an electron injection layer of Liq(1 nm) were sequentially formed on the high-reflection electrode 150', and a translucent electrode 110' of Mg:Ag (18 nm) was formed thereon, so as to fabricate a red organic light-emitting device. This organic light-emitting device was configured such that the organic light-emitting layer was formed on a substrate of 25 mm×25 mm at an area of 50% and a light emission size of 100 um×300 um, and a transparent window 160 was fabricated such that its area accounts for 50% of the total area of the organic light-emitting device.

<Preparation of Electrochromic Solution>

5.1 wt % of tetra-n-butylamonium tetrafluoroborate was provided as an electrolyte salt, and 10.0 wt % of Black 100 was provided as an electrochromic material. 2.9 wt % of dimethylhydroquinone, 0.5 wt % of ferrocene, and 14.9 wt % of benzil were respectively provided as electron-accepting molecules. The aforementioned electrolyte salt, electrochromic material and electron-accepting molecules were mixed for 40 to 60 minutes using an organic solvent (N,N-diethylacetamide) and a stirrer, so as to prepare an electrochromic solution to be used for forming an electrochromic layer 230'.

<Combination of Organic Light-Emitting Device and Electrochromic Device>

In order to form an electrochromic layer 230' under the high-reflection electrode 150', a third transparent electrode 210' for ITO EC was formed to a thickness of 150 nm beneath the first transparent substrate 10'. Then, a spacer was formed under the third transparent electrode 210' for EC, and a space, into which the electrochromic solution is to be injected, was formed to a height of 10 m to 50 m between the third transparent electrode 210' and a fourth transparent electrode 250' of 150 nm for ITO EC. The electrochromic solution was injected into the space formed by the spacer, and then the device was sealed.

Experimental Example 2

<Fabrication of Organic Light-Emitting Device>

As shown in FIG. 1, a transparent ITO electrode, as a first electrode 110, was formed to a thickness of 150 nm on a glass substrate, which is used as a first transparent 10, and an organic material layer was formed on the transparent ITO electrode by thermal deposition at a vacuum of $2.5 \times 10^{-7}$ torr or less. Then, as the organic material layer, a hole transport layer 120 of DNTPD(10 nm)/NPB(30 nm), a light-emitting layer 130 of Bebq$_2$:Ir(mphnq)$_2$[3%](20 nm), and an electron transport layer 140 of Bphen(50 nm)/Lithium (1 nm) were sequentially formed on the first electrode 110. As a second electrode 150, a high-reflection translucent electrode was formed on the electron transport layer 140. The high-reflection translucent electrode was coated with Ag(12 nm)/WO$_3$(30 nm), so as to fabricate a red organic light-emitting device.

<Preparation of Electrochromic Solution>

5.1 wt % of tetra-n-butylamonium tetrafluoroborate was provided as an electrolyte salt, and 10.0 wt % of Black 100 was provided as an electrochromic material. 2.9 wt % of dimethylhydroquinone, 0.5 wt % of ferrocene, and 14.9 wt % of benzil were respectively provided as electron-accepting molecules. The aforementioned electrolyte salt, electrochromic material and electron-accepting molecules were mixed for 40 to 60 minutes using an organic solvent (N,N-diethylacetamide) and a stirrer, so as to prepare an electrochromic solution to be used for forming an electrochromic layer 230.

<Combination of Organic Light-Emitting Device and Electrochromic Device>

In order to form an electrochromic layer 230 under the high-reflection translucent electrode 150, a third transparent electrode 210 for ITO EC was formed to a thickness of 150 nm beneath the first transparent substrate 10. Then, a spacer was formed under the third transparent electrode 210 for EC, and a space, into which the electrochromic solution is to be injected, was formed to a height of 10 m to 50 m between the third transparent electrode 210 and a fourth transparent electrode 250 of 150 nm for ITO EC. The electrochromic solution was injected into the space formed by the spacer, and then the device was sealed.

Comparative Example 1

Comparing Comparative Example 1 with the above Experimental Example 1, a transparent electrode having high transmittance was used instead of the high-reflection electrode 150'.

In Comparative Example 1, a process of forming a high-reflection layer made of a silver(Ag)-containing alloy on a glass substrate was excluded, and a transparent ITO anode having a thickness of 150 nm was formed on the glass substrate.

Comparative Example 2

Comparing Comparative Example 2 with the above Experimental Example 1, a third transparent electrode 210' for EC, an electrochromic layer 230', a fourth transparent electrode 250' for EC, and a second transparent substrate 20' were sequentially formed on a third transparent substrate 30'.

Thus, the electrochromic device is to be formed on a surface to allow a person to directly see the organic light-emitting device.

TABLE 1

|  | Transmittance of device (%) | Light efficiency of organic light-emitting device (lm/W) | Contrast ratio (based on 400 lux) |
| --- | --- | --- | --- |
| Experimental Example 1 | 43.7 | 35.7 | 131687:1 |
| Comparative Example 1 | 50.5 | 4.5 | 7523:1 |
| Comparative Example 2 | 43.2 | 0.004 | 4:1 |

In the experiments, the transmittance of the device was measured at 550 nm, the light efficiency of the organic light-emitting device was measured at 1000 nit, and, in this case, a drive voltage was 5V.

As seen in Table 1 above, comparing Comparative Example 1 with Experimental Example 1, the transmittance of the device is high, whereas the light efficiency of the organic light-emitting device is low. Among Experimental Example 1, Comparative Example 1 and Comparative Example 2, the transmittance of the device in Comparative Example 1 was measured to be highest, and the light efficiency of the organic light-emitting device in Experimental Example 1 was measured to be highest. The transmittance of the device in Experimental Example 1 was measured to be low compared to the transmittance of the device in Comparative Example 1 by about 7%, whereas the light efficiency of the organic light-emitting device and contrast ratio of the device in Experimental Example 1 were measured to be remarkably high compared to the light efficiency of the organic light-emitting device and contrast ratio of the device in Comparative Example 1. Therefore, if the anode of the organic light-emitting device is realized into a high-reflection electrode and is provided with a light transmission portion, high light efficiency and high contrast ratio can be obtained while obtaining a transmittance of about 43%.

Experimental Example 3

<Fabrication of Organic Light-Emitting Device>

As shown in FIG. 6, a transparent ITO electrode, as a first electrode 110, was formed to a thickness of 150 nm on a glass substrate, which is used as a first transparent 10, and an organic material layer was formed on the transparent ITO electrode by thermal deposition at a vacuum of $2.5\times10^{-7}$ torr or less. Then, as the organic material layer, a hole transport layer 120 of NPB(30 nm)/TCTA(10 nm), a light-emitting layer 130 of CBP:Ir(ppy)3[5%](20 nm), and an electron transport layer 140 of Bphen(35 nm)/Lithium qinolate(1 nm) were sequentially formed on the transparent ITO electrode 110. As a second electrode 150, a high-reflection translucent electrode was formed on the electron transport layer 140. The high-reflection translucent electrode was coated with Ag(12 nm)/WO$_3$(30 nm), so as to fabricate a green organic light-emitting device.

<Preparation of Electrochromic Solution>

5.1 wt % of tetra-n-butylamonium tetrafluoroborate was provided as an electrolyte salt, and 10.0 wt % of Black 100 was provided as an electrochromic material. 2.9 wt % of dimethylhydroquinone, 0.5 wt % of ferrocene, and 14.9 wt % of benzil were respectively provided as electron-accepting molecules. The aforementioned electrolyte salt, electrochromic material and electron-accepting molecules were mixed for 40 to 60 minutes using an organic solvent (N,N-diethylacetamide) and a stirrer, so as to prepare an electrochromic solution to be used for forming an electrochromic layer 230.

<Combination of Organic Light-Emitting Device and Electrochromic Device>

In order to form an electrochromic layer 230 over the second electrode 150, which is a high-reflection translucent electrode, a bonding layer 30 was realized into a transparent substrate having excellent transmittance, and a third transparent electrode 210 for ITO EC was formed to a thickness of 150 nm on the bonding layer 30. Then, a spacer was formed over the third transparent electrode 210 for EC, a fourth transparent electrode 250 for EC was formed to a thickness of 150 nm on the spacer by using ITO, and a space, into which the electrochromic solution is to be injected, was found to a height of 10 m to 50 m between the third transparent electrode 210 and the fourth transparent electrode 250 of 150 mu for ITO EC. The electrochromic solution was injected into the space formed by the spacer, and then the device was sealed.

Comparative Example 3

Comparing Comparative Example 3 with the above Experimental Example 3, a transparent electrode having high transmittance was used instead of the high-reflection electrode 150. A cathode having high transmittance was formed to a thickness of 60 nm using ITO through a low damage sputtering process.

Comparative Example 4

Comparing Comparative Example 4 with the above Experimental Example 3, a third transparent electrode 210 for EC, an electrochromic layer 230, a fourth transparent electrode 250 for EC, and a second transparent substrate 20 were sequentially formed beneath a first transparent substrate 10.

Thus, the electrochromic device is to be formed on a surface to allow a person to directly see the organic light-emitting device.

TABLE 1

|  | Transmittance of device (%) | Light efficiency of organic light-emitting device (lm/W) | Contrast ratio (based on 400 lux) |
| --- | --- | --- | --- |
| Experimental Example 2 | 60.7 | 14.6 | 45140:1 |
| Experimental Example 3 | 65.1 | 7.1 | 27646:1 |
| Comparative Example 3 | 63.8 | 5.3 | 8065:1 |
| Comparative Example 4 | 60.1 | 0.006 | 4:1 |

In the experiments, the transmittance of the device was measured at 550 mu, the light efficiency of the organic light-emitting device was measured at 1000 nit, and, in this case, a drive voltage was 5V. However, in Comparative Example 4, the maximum light efficiency of the organic light-emitting device was described because the organic light-emitting device cannot exhibit sufficient brightness.

As seen in Table 2 above, comparing Comparative Example 3 with Experimental Example 3, the transmittance of the device is high, whereas the light efficiency of the organic light-emitting device is low. Among Experimental Example 3, Comparative Example 3 and Comparative Example 4, the transmittance of the device in Comparative Example 3 was measured to be highest, and the light efficiency of the organic light-emitting device in Experimental Example 3 was measured to be highest. The transmittance of the device in Experimental Example 3 was measured to be low compared to the transmittance of the device in Comparative Example 3 by about 3%, whereas the light efficiency of the organic light-emitting device and contrast ratio of the device in Experimental Example 3 were measured to be remarkably high compared to the light efficiency of the organic light-emitting device and contrast ratio of the device in Comparative Example 3. Therefore, if the anode of the organic light-emitting device is realized into a high-reflection electrode, high light efficiency and high contrast ratio can be obtained while obtaining a transmittance of about 60%.

Further, as seen in Table 2 above, it can be ascertained that the device in Experimental Example 3 has high transmittance compared to the device in Experimental Example 2, whereas the device in Experimental Example 3 has a relatively low contrast ratio compared to the device in Experimental Example 2. Therefore, if the cathode of the organic light-emitting device is realized into a high-reflection translucent electrode, relatively high light efficiency and relatively high contrast ratio can be obtained while obtaining a transmittance of about 65%.

Figure 8:
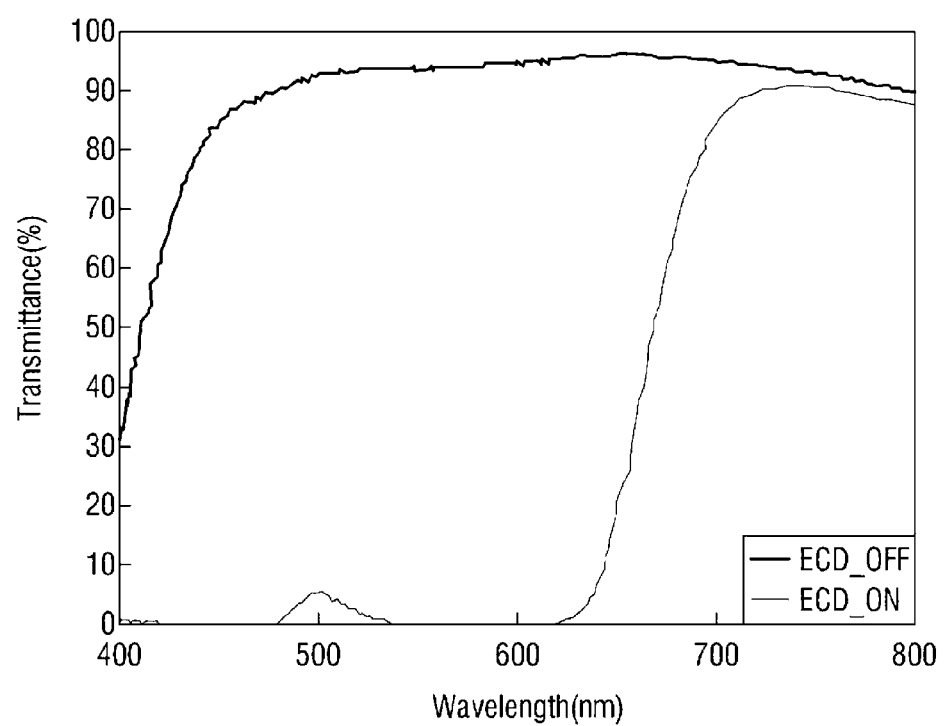
FIG. 8 is a graph showing the transmittance characteristics in a visible light range when using a leuco dye as an electrochromic material.

Meanwhile, FIG. 8 is a graph showing the transmittance characteristics in a visible light range when using a leuco dye as the electrochromic material. More specifically, FIG. 8 shows the transmittance characteristics in a visible light range when Black 100 was used as the leuco dye. From FIG. 8, it can be seen that the Black 100 exhibits a high color change rate in the visible light range compared to another electrochromic material (generally, $WO_3$ or Viologen) when a colored mode is operated by the application of a voltage. For reference, in order to realize a black electrochromic device blocking light, a black leuco dye can be used, or a mixture of blue and red leuco dyes can be used.

According to the present invention, when a voltage is not applied to the electrochromic device, a portion at which the electrochromic device is located becomes transparent, and thus the smart window according to the present invention can be used as a double side emission type smart window. In contrast, when a voltage is applied to the electrochromic device, a portion at which the electrochromic device is located becomes black, and thus the smart window according to the present invention can be used as a one side emission type smart window (bottom emission type smart window or top emission type smart window).

As described above, according to the smart window of the present invention, a transparent electrode of a conventional organic light-emitting device disposed adjacent to the electrochromic device is replaced with a high-reflection electrode, and a predetermined light transmission portion is formed, thereby minimizing the absorption of light by the electrochromic device, so as to improve the light efficiency and contrast ratio of an organic light-emitting device.

Further, according to the smart window of the present invention, transmittance characteristics can be improved when a voltage is applied to or not applied to the electrochromic device using a leuco dye.

Therefore, the smart window of the present invention can be effectively used as a one side emission type double side emission type illuminator or display.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A smart window, comprising:
    an organic light-emitting device including first and second electrodes corresponding to each other, and a light-emitting layer disposed between the first and second electrodes and containing an organic light-emitting material;
    an electrochromic device including an electrochromic layer containing an electrochromic material and disposed over the organic light-emitting device,
    wherein the organic light-emitting device is disposed under the electrochromic device to form a light transmission portion in a predetermined region, and
    wherein the first electrode is formed of a transparent electrode or a high-reflection translucent electrode, and the second electrode is formed of a high-reflection electrode.

2. The smart window of claim 1,
    wherein the area of the light transmission portion accounts for 20% to 90% of the total area of the smart window.

3. The smart window of claim 1,
    wherein the size of a short axis of the second electrode is 500 um or less when the light transmission portion is formed using the second electrode.

4. The smart window of claim 1,
    wherein the electrochromic device is disposed on the second electrode.

5. The smart window of claim 1,
    wherein the electrochromic device further includes third and fourth electrodes corresponding to each other, and the electrochromic layer is disposed between the third and fourth electrodes.

6. The smart window of claim 1,
    wherein the high-reflection electrode is formed of a silver (Ag) electrode, an aluminum (Al) electrode, a single-layered or multi-layered electrode containing at least one of silver (Ag) and aluminum (Al), or a combination electrode of a transparent oxide electrode and an dielectric mirror.

7. The smart window of claim 1,
    wherein a hole transport layer or an electron transport layer is additionally disposed between the first electrode and the light-emitting layer, and
    an electron transport layer or a hole transport layer is additionally disposed between the second electrode and the light-emitting layer.

8. The smart window of claim 1,
    wherein the organic light-emitting device and the electrochromic device are attached to each other through a bonding layer.

9. The smart window of claim 8,
    wherein the boding layer is formed of at least one of a transparent substrate and a multi-layered thin film.

10. The smart window of claim 1,
    wherein the electrochromic layer has any one of a multi-layered thin film state, a solution state, and a mixed state of the multi-layered thin film state and the solution state.

11. The smart window of claim 1,
    wherein the electrochromic layer is formed using a solution containing an electrochromic material, an electrolyte salt, solvent, and an electron-accepting molecule.

12. The smart window of claim 1,
    wherein the electrochromic material includes a isobenzofuranone-based compound.

13. The smart window of claim 12,
    wherein the electrochromic material includes an isobenzofuranone-based compound having an amino group as an electron donor unit or an isobenzofuranone-based compound having a lactone ring.

14. The smart window of claim 1,
wherein the electrochromic material includes a leuco dye.

15. The smart window of claim 1,
wherein the electrochromic material includes a metal oxide or a conductive polymer.

16. A smart window, comprising:
a first transparent substrate;
a first electrode disposed on the first transparent substrate;
a light-emitting layer disposed on the first electrode and containing an organic light-emitting material;
a second electrode disposed on the light-emitting layer;
a bonding layer disposed on the second electrode;
a third electrode disposed on the bonding layer;
an electrochromic layer disposed on the third electrode and containing an electrochromic material;
a fourth electrode disposed on the electrochromic layer; and
a second transparent substrate disposed on the fourth electrode,
wherein the first electrode, the light-emitting layer, and the second electrode are disposed to form a light transmission portion in a predetermined region between the first transparent substrate and the bonding layer, and
wherein the first electrode is formed of a transparent electrode or a high-reflection translucent electrode, and the second electrode is formed of a high-reflection electrode.

17. A smart window, comprising:
a first transparent substrate;
an organic light-emitting device disposed on the first transparent substrate;
an electrochromic device disposed beneath the first transparent substrate;
a second transparent substrate disposed beneath the electrochromic device; and
a third transparent substrate disposed on the organic light-emitting device,
wherein the organic light-emitting device includes a second electrode disposed on the first transparent substrate and formed of a high-reflection electrode, a light-emitting layer disposed on the second electrode and containing an organic light-emitting material, and a first electrode disposed on the light-emitting layer and formed of a transparent electrode or a high-reflection translucent electrode,
wherein the electrochromic device includes a third electrode disposed beneath the first transparent substrate, an electrochromic layer disposed beneath the third electrode and containing an electrochromic material, and a fourth electrode disposed beneath the electrochromic layer, and
wherein the first electrode, the light-emitting layer, and the second electrode is disposed to form a light transmission portion in a predetermined region between the first transparent substrate and the third transparent substrate.

* * * * *